United States Patent
Lin et al.

(10) Patent No.: US 9,768,237 B2
(45) Date of Patent: Sep. 19, 2017

(54) ORGANIC LIGHT EMITTING DIODE DISPLAY PANEL AND ORGANIC LIGHT EMITTING DIODE DISPLAY DEVICE CONTAINING THE SAME

(71) Applicant: INNOLUX CORPORATION, Chu-Nan, Miao-Li County (TW)

(72) Inventors: Jeng-Nan Lin, Chu-Nan (TW); Kuang-Pin Chao, Chu-Nan (TW); Ming-Chien Sun, Chu-Nan (TW); Hsia-Ching Chu, Chu-Nan (TW); Jia-Ren Lin, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/475,419

(22) Filed: Sep. 2, 2014

(65) Prior Publication Data
US 2015/0090982 A1    Apr. 2, 2015

(30) Foreign Application Priority Data

Sep. 27, 2013   (TW) .............................. 102134993 A

(51) Int. Cl.
*H01L 27/32* (2006.01)
*H01L 51/52* (2006.01)

(52) U.S. Cl.
CPC ...... *H01L 27/3246* (2013.01); *H01L 27/3251* (2013.01); *H01L 51/525* (2013.01); *H01L 27/3281* (2013.01)

(58) Field of Classification Search
USPC ......................................................... 257/40
IPC ........ H01L 51/525,51/5237, 27/3251, 27/3246, 27/3281
See application file for complete search history.

(56) References Cited

U.S. PATENT DOCUMENTS

| | | | |
|---|---|---|---|
| 2005/0012889 | A1 | 1/2005 | Ishii et al. |
| 2008/0297704 | A1 | 12/2008 | Hashimoto |
| 2010/0171416 | A1 | 7/2010 | Lee |
| 2011/0221334 | A1 | 9/2011 | Kwon et al. |
| 2012/0025229 | A1 | 2/2012 | Lee et al. |
| 2012/0273804 | A1 | 11/2012 | Hatano |
| 2012/0313123 | A1 | 12/2012 | Kim |

FOREIGN PATENT DOCUMENTS

| | | |
|---|---|---|
| CN | 101290436 | 10/2008 |
| EP | 1814185 | 8/2007 |

*Primary Examiner* — Hrayr A Sayadian
(74) *Attorney, Agent, or Firm* — Liu & Liu

(57) ABSTRACT

An organic light emitting diode display panel is disclosed, which comprises: a first substrate with an organic light emitting layer formed thereon; a second substrate corresponding to the first substrate, and adhered to the first substrate with a frit sealant; and plural spacers disposed between the first substrate and the second substrate, and comprising a first spacer, a second spacer and a third spacer adjacent to each other, wherein shapes of a first projection of the first spacer, a second projection of the second spacer and a third projection of the third spacer on the second substrate are different from each other. In addition, the present invention also disclosed an organic light emitting diode display device containing the same.

8 Claims, 8 Drawing Sheets

ORGANIC LIGHT EMITTING DIODE DISPLAY PANEL AND ORGANIC LIGHT EMITTING DIODE DISPLAY DEVICE CONTAINING THE SAME

CROSS REFERENCE TO RELATED APPLICATION

This application claims the benefits of the Taiwan Patent Application Serial Number 102134993, filed on Sep. 27, 2013, the subject matter of which is incorporated herein by reference.

BACKGROUND OF THE INVENTION

1. Field of the Invention

The present invention relates to an organic light emitting diode (OLED) display panel and an OLED display device containing the same and, more particularly, to an OLED display panel with spacers having novel structures and an OLED display device containing the same.

2. Description of Related Art

Organic light-emitting diodes (OLEDs) are light in weight and ultra-thin in thickness, and also have advantages of high brightness, rapid response, wide viewing angles, no backlight requirement, low manufacturing cost and flexibility. Hence, OLEDs have great potential to apply on display panels of various electronic devices such as panels of cell phones, mobiles and MP3 players.

During the process for manufacturing the OLED display devices, thin film transistors and organic light emitting units are formed on a bottom substrate in advance, and then the obtained bottom substrate are assembled with a top substrate having spacers formed thereon. For the conventional OLED display devices, both the top substrate and the bottom substrate are glass substrates, which are adhered to each other with a frit sealant during the assembling process. However, during the laser heating process, a shift between the top substrate and the bottom substrate may be occurred, and the assembling difference may cause the yield rate of the OLED display devices reduced.

Therefore, it is desirable to provide OLED display devices without assembling differences to improve the yield rate thereof.

SUMMARY OF THE INVENTION

An object of the present invention is to provide an organic light emitting diode (OLED) display panel, in which spacers with novel structures are used. In addition, the present invention further provides an organic light emitting diode display device manufactured by the aforementioned OLED display panel.

To achieve the object, an aspect of the OLED display panel of the present invention comprises: a first substrate with an organic light emitting layer formed thereon; a second substrate corresponding to the first substrate, and adhered to the first substrate with a frit sealant; and plural spacers disposed between the first substrate and the second substrate, and comprising a first spacer, a second spacer and a third spacer adjacent to each other, wherein a first projection, a second projection and a third projection of the first spacer, the second spacer and the third spacer are respectively formed on the second substrate, and shapes of the first projection, the second projection and the third projection are different from each other. More specifically, a first projection, a second projection and a third projection of the first spacer, the second spacer and the third spacer are respectively formed on the second substrate, and shapes of the first projection, the second projection and the third projection are different from each other. Herein, the second substrate may further comprise or be defined into a display region and a non-display region.

In general, the spacers used in the conventional OLED display panel have identical shapes, and the projections thereof on the second substrate also have the same shapes. However, in the OLED display panel of the present invention, the used spacers can form projections having different shapes on the second substrate, so the present invention provides an OLED display panel with spacers having novel shapes.

Especially, in the OLED display panel of this aspect of the present invention, at least one of the spacers respectively has a rough or uneven surface. During the process for assembling the first substrate and the second substrate, the rough surface of the at least one of the spacers can provide frictional force to reduce the shift between the first substrate and the second substrate.

More specifically, in the OLED display panel of the present invention, the so-called rough or uneven surface indicates that the surface of at least one of the spacer has plural cavities or plural protrusions. When plural cavities are formed in the surfaces of the spacers, the size of each cavity is not particularly limited. Preferably, the sizes of at least two of the cavities in at least one of the spacer are selectively identical to or different from each other. More preferably, the sizes of the at least two cavities in at least one of the spacer are different from each other. Meanwhile, the depth of each cavity is not particularly limited. Preferably, the depths of at least two of the cavities in at least one of the spacer are selectively identical to or different from each other. More preferably, the depths of the at least two of the cavities in at least one of the spacer are different from each other. In the most preferable case, both the sizes and the depths of the at least two of the cavities in at least one of the spacer are different from each other. In addition, when plural protrusions are formed on the surfaces of the spacers, the size of each protrusion is not particularly limited. Preferably, the sizes of at least two of the protrusions in at least one of the spacer are selectively identical to or different from each other. More preferably, the sizes of the at least two of the protrusions in at least one of the spacer are different from each other. Meanwhile, the height of each protrusion is not particularly limited. Preferably, the heights of the protrusions in each spacer are selectively identical to or different from each other. More preferably, the heights of at least two of the protrusions in at least one of the spacer are different from each other. In the most preferable case, both the sizes and the heights of the at least two of the protrusions in at least one of the spacer are different from each other.

Except for the OLED display panel illustrated in the aforementioned aspect, another aspect of the present invention further provides an OLED display panel, comprising a display region and a non-display region, which comprises: a first substrate with an organic light emitting layer formed thereon in the display region; a second substrate corresponding to the first substrate, and adhered to the first substrate with a frit sealant; and plural spacers disposed between the first substrate and the second substrate, wherein at least one of the spacers is a cluster formed by plural protrusions, and heights of the protrusions in the spacer are identical to or different from each other.

The OLED display panel of this aspect of the present invention is characterized in that at least one of the spacer therein is a cluster formed by plural protrusions, so the formed spacer has a rough or uneven surface. During the process for assembling the first substrate and the second substrate, the rough surfaces of the spacers can provide frictional force to reduce the shift between the first substrate and the second substrate.

In the OLED display panel of this aspect of the present invention, at least one of the spacer can be a cluster formed by plural protrusions. Preferably, ends of the protrusions in at least one of the spacer facing to the second substrate connect to each other. More preferably, the protrusions in at least one of the spacers are integrated with each other. In addition, at least two of the protrusions have different heights in at least one of the spacers.

In the OLED display panel of this aspect of the present invention, the spacers comprises a first spacer, a second spacer and a third spacer, and a first projection, a second projection and a third projection of the first spacer, the second spacer and the third spacer are respectively formed on the second substrate, and shapes of the first projection, the second projection and the third projection are different from each other. More specifically, a first projection, a second projection and a third projection of the first spacer, the second spacer and the third spacer are respectively formed on the second substrate, and shapes of the first projection, the second projection and the third projection can be selectively identical to or different from each other. Preferably, the shapes of the first projection, the second projection and the third projection are different from each other. More preferably, the first spacer, the second spacer and the third spacer are adjacent to each other, and the shapes of the first projection, the second projection and the third projection are different from each other.

In addition, in the OLED display panels of both aforementioned aspects of the present invention, a distance between two adjacent spacers in the display region may be different from that in the non-display region. Preferably, the distance between two adjacent spacers in the display region is larger than that in the non-display region. Hence, when the first substrate and the second substrate are assembled with the frit sealant, the increased disposition density of the spacers in the non-display region can provide larger frictional force to prevent the shift between the first substrate and the second substrate. Furthermore, sizes of the spacers in the display region may also be different from those in the non-display region. Preferably, the sizes of the spacers in the display region are larger than those in the non-display region. Alternatively, projected areas of the projections of the spacers may be different from each other. Preferably, the projected areas thereof in the display region are larger than those in the non-display region. Since the spacers in the non-display region have smaller sizes or projected areas, the area of the non-display region can be reduced to achieve the purpose of narrow frame. In the most preferable case, not only the distance between two adjacent spacers in the display region is larger than that in the non-display region, but also the sizes of the spacers in the display region are larger than those in the non-display region. Therefore, the spacers can provide enough frictional force, and the purpose of narrow frame can also be achieved.

Moreover, in the OLED display panels of both the aforementioned aspects of the present invention, a first electrode layer comprising plural first electrode units is further disposed on the first substrate, and the organic light emitting diode display panel may further comprise a pixel defining layer disposed between the first electrode units. In addition, the pixel defining layer may have at least one recess corresponding to at least one of the spacers. More specifically, when the spacers is disposed to correspond to the pixel defining layer, the pixel defining layer is easily deformed by external force, so recesses corresponding to the spacers may be formed on the pixel defining layer.

In the OLED display panels of both the aforementioned aspects of the present invention, the spacers can be made of any spacer material generally used in the art, such as a photoresist spacer material. Preferably, the spacers comprise a non-conductive material, such as polyimide (PI), polysulfone (PS), and polycarbonate (PC).

Except for the aforementioned OLED display panels, the present invention further provides an OLED display device manufactured by the same, which comprises: a driving unit; and any one of the aforementioned OLED display panels electrically connecting to the driving unit. Herein, the driving unit is used to activate the OLED display panel.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1A:
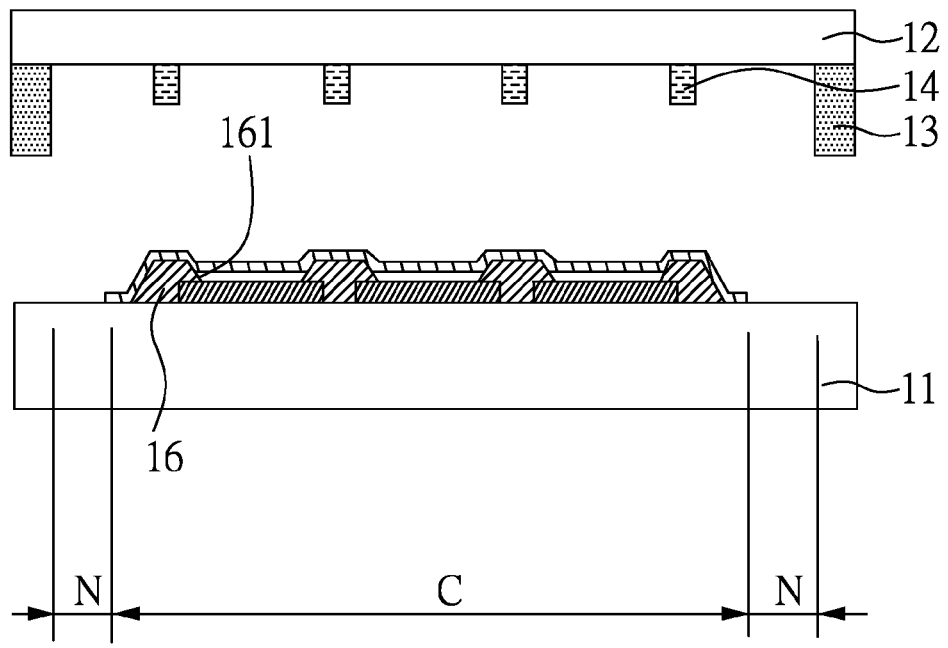
FIGS. 1A to 1B are cross-sectional views showing a process for assembling an OLED display panel according to Embodiment 1 of the present invention.
Figure 1B:
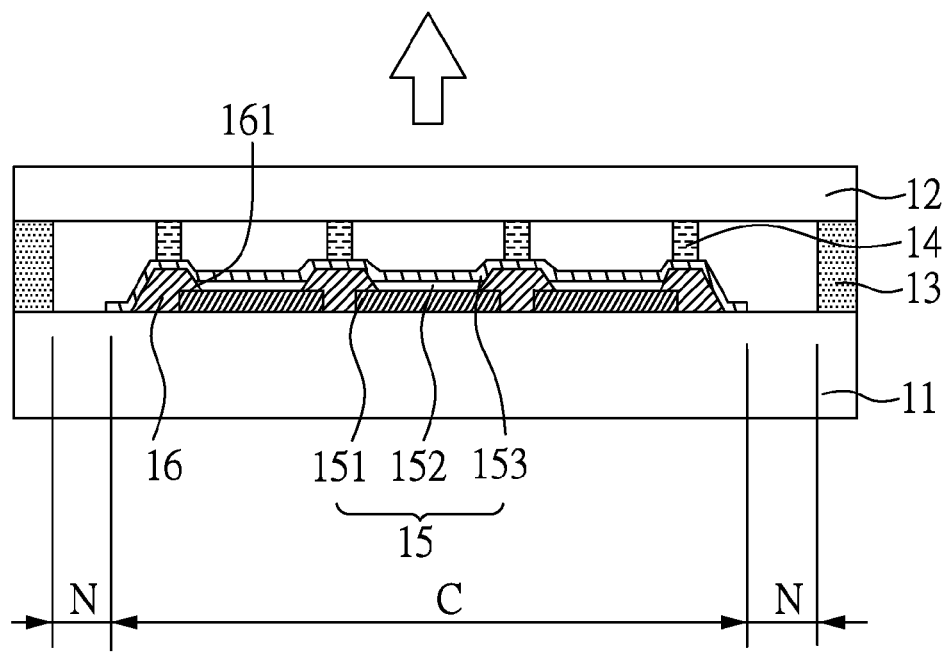

FIGS. 1A to 1B are cross-sectional views showing a process for assembling an OLED display panel of the present embodiment. As shown in FIG. 1, during the process for assembling an OLED display panel, a first substrate 11 and a second substrate 12 are firstly provided. Herein, organic light emitting (OLED) layers 15 and a pixel defining layer 16 are disposed on the first substrate 11, and the pixel defining layer 16 is disposed between two adjacent OLED layers 15. In the present embodiment, each OLED layer 15 can respectively emit red light, green light and blue light; but the color of light emitting from the OLED layers 15 is not limited thereto in other embodiment. In addition, plural spacers 14 are formed on the second substrate 12, and a frit sealant 13 is firstly formed on edges of the second substrate 12. Herein, the frit sealant 13 is formed thereon sequentially through a dispensing process and a sintering process.

Next, as shown in FIG. 1B, the first substrate 11 and the second substrate 12 are assembled to each other, wherein the spacers 14 correspond to a region besides pixel opening 161 of the pixel defining layer 16. After a laser heating process, the frit sealant 13 is adhered to the first substrate 11 to obtain the top-emitting OLED display panel of the present embodiment. In the present embodiment, both the first substrate 11 and the second substrate 12 are glass substrates. In addition, as shown in FIGS. 1A and 1B, the OLED display panel of the present embodiment further comprises a display region C and a non-display region N, and the so-called non-display region N is a region having circuits. In the present embodiment, the frit sealant 13 is used to prevent the air and moisture permeation. However, in other embodiment, other sealants may be used.

Figure 2:
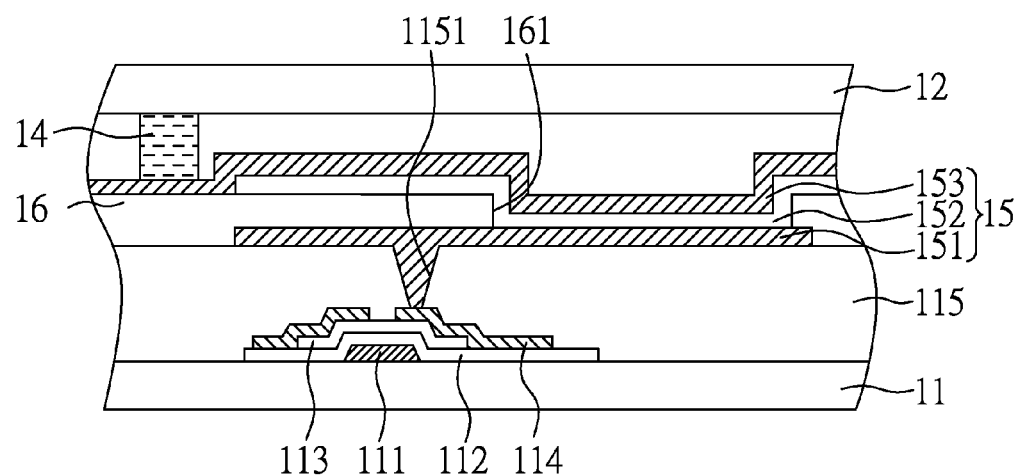
FIG. 2 is a cross-sectional view of an OLED display panel according to Embodiment 1 of the present invention.

FIG. 2 is a cross-sectional view of a part of an OLED display panel of the present embodiment. The OLED display of the present embodiment comprises: a first substrate 11 and a second substrate 12 corresponding to the first substrate 11. Herein, a gate electrode 111, a gate insulating layer 112, a semiconductor layer 113 and a source and drain layer 114 are sequentially laminated on the first substrate 11 to obtain a thin film transistor (TFT). In the present embodiment, only one kind of TFT is exemplified, but the present invention is not limited thereto. Other TFTs generally used in the art (for example, IGZO-TFT) can also be applied to the OLED display panel of the present invention. In addition, a planer layer 115 is further laminated on the TFT, which has a planer opening 1151 to expose the source and drain layer 114.

Next, a first electrode unit 151 is formed on the planer layer 115 and in the planer opening 1151, and then a pixel defining layer 16 with a pixel opening 161 is laminated thereon. After an organic light emitting layer 152 and a second electrode unit 153 are sequentially formed on the pixel defining layer 16 and the first electrode unit 151 as well as in the pixel opening 161, an organic light emitting unit 15 of the present embodiment is obtained. Hence, the organic light emitting unit 15 of the present embodiment comprises: the first electrode unit 151, the organic light emitting layer 152 and the second electrode unit 153, and the first electrode unit 151 electrically connects to the source and drain layer 114. Furthermore, the pixel defining layer 16 is disposed between the first electrode unit 151 and the organic light emitting layer 152, and a light emitting region is defined by the pixel opening 161 of the pixel defining layer 16. Herein, the first electrode unit 151 and the second electrode unit 153 can respectively be transparent electrodes or semi-transparent electrodes generally used in the art. The transparent electrodes can be transparent conductive oxide electrodes (TCO electrodes), such as ITO electrodes or IZO electrodes; and the semi-transparent electrodes can be metal thin film electrodes, such as Mg/Ag alloy thin film electrodes, Au thin film electrodes, Pt thin film electrodes and Al thin film electrodes. In addition, if it is necessary, at least one of the first electrode unit 151 and the second electrode unit 153 can be a composite electrode of a transparent electrode and a semi-transparent electrode, such as a composite electrode of an TCO electrode and a Pt thin film electrode. Herein, only the organic light emitting unit comprising a first electrode unit 151, an organic light emitting layer 152 and a second electrode unit is exemplified in the present embodiment, but the present invention is not limited thereto. Other organic light emitting unit having different structures may be used in the OLED display panel of the present invention. For example, an organic light emitting unit comprising an electron transporting layer, an electron injection layer, a hole transporting layer, a hole injection layer, and other layers facilitating the combination between electrodes and holes can be used in the present invention.

Figure 3:
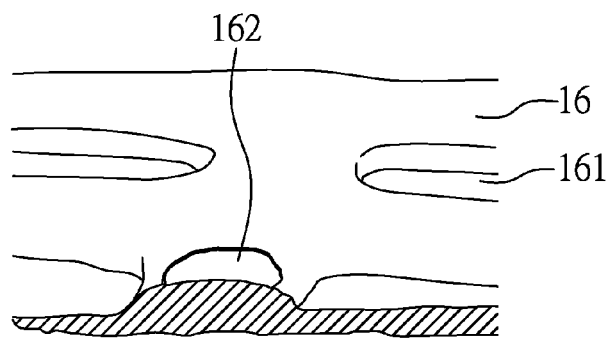
FIG. 3 is a perspective view of a pixel defining layer of an OLED display panel according to Embodiment 1 of the present invention.

As shown in FIG. 1B and FIG. 2, the spacers 14 on the second substrate 12 correspond to the pixel defining layer 16 to assemble the first substrate 11 and the second substrate 12 to obtain the OLED display panel of the present embodiment. The hardness of the spacer 14 is high enough to cause that a recess 162 corresponding to the spacer 14 is formed in the pixel defining layer 16. More specifically, only an imprint (i.e. the recess 162) caused by the spacer 14 is formed but no residue is remained on the pixel defining layer 16, as shown in FIG. 3. Additionally, the spacer 14 used in the present embodiment is made of a non-conductive material, such as polyimide (PI), polysulfone (PS), and polycarbonate (PC).

Figure 4A:
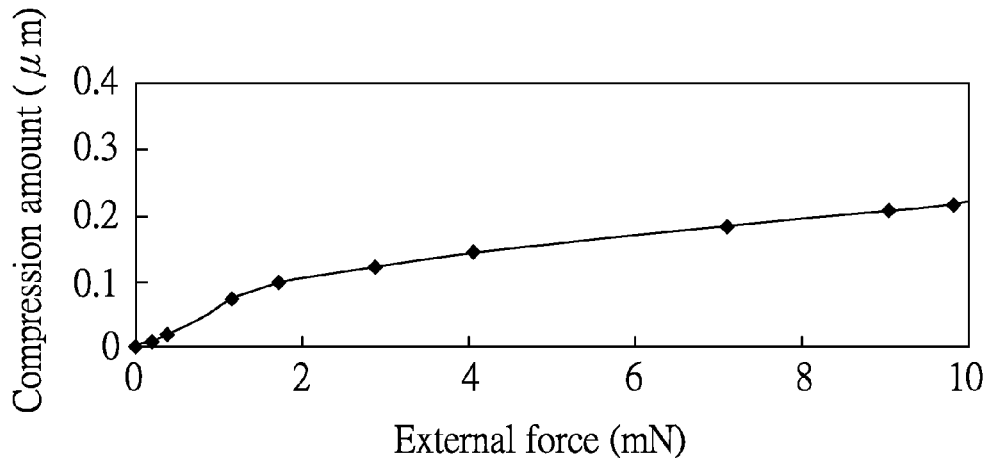
FIGS. 4A to 4B are graphs showing relations between external force and deformation amount of a spacer or a pixel defining layer in an OLED display panel according to Embodiment 1 of the present invention.
Figure 4B:
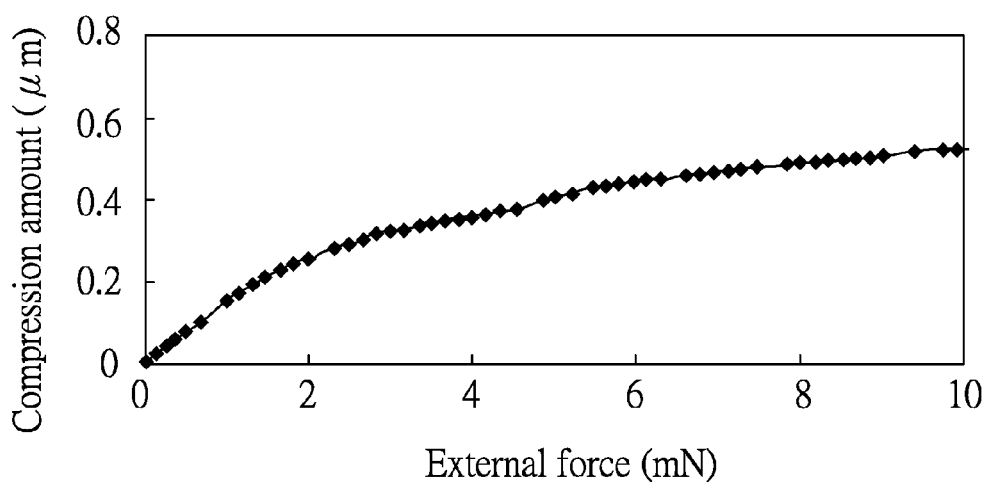

FIGS. 4A to 4B are graphs respectively showing relations between external force and deformation amount of a spacer or a pixel defining layer in an OLED display panel of the present embodiment. As shown in the FIG. 4A of the graph showing the relation between the external force and the deformation amount of the spacer, and the FIG. 4B of the graph showing the relation between the external force and the deformation amount of the pixel defining layer, when the spacer and the pixel defining layer is compressed due to the external force, the deformation amount (i.e. the compression amount shown in the Y-axis) of the pixel defining layer caused by the external force is larger than that of the spacer. This result indicates that the pixel defining layer is much easier to be deformed by the external force than the spacer. Hence, after the first substrate 11 and the second substrate 12 are assembled to each other (as shown in FIG. 2), the spacer 14 causes the pixel defining layer 16 having an imprint formed thereon, which can be represented by the recess 162 shown in FIG. 3.

In order to prevent the shift between the first substrate 12 and the second substrate 12 during the assembling process, the spacer 14 used in the present embodiment has a novel tiny structure, which can increase the frictional force between the first substrate 11 and the second substrate 12. Hereinafter, the structure of the spacer 14 used in the OLED display panel of the present embodiment is described in detail.

Figure 5A:
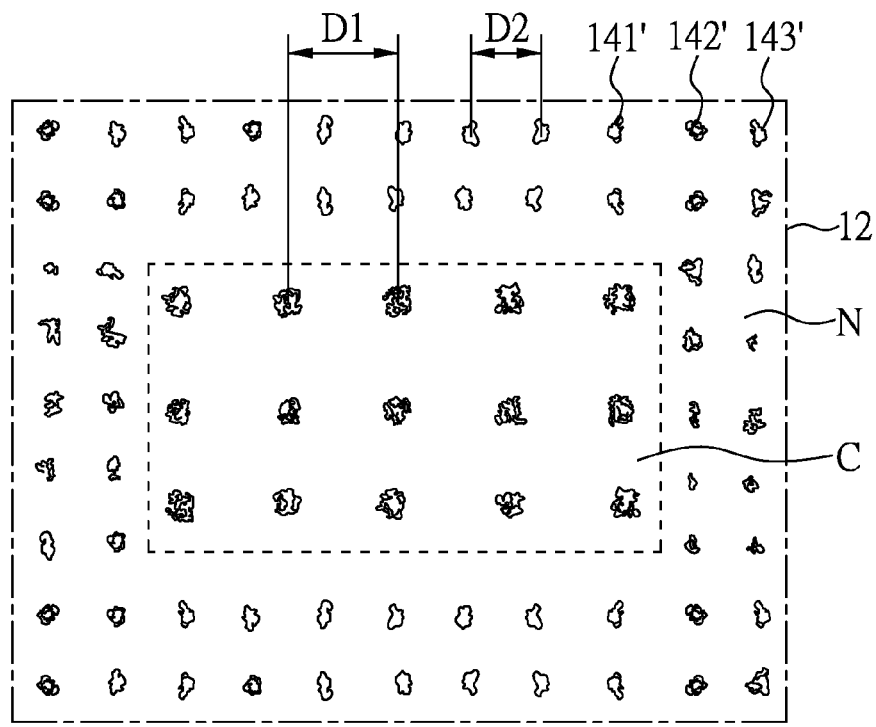
FIGS. 5A to 5B are perspective views showing projections of spacers on a second substrate in an OLED display panel according to Embodiment 1 of the present invention.

FIG. 5A is perspective view showing projections of spacers on the second substrate in the OLED display panel of the present embodiment. In the OLED display panel of the present embodiment, shapes of the projections of the plural spacers on the second substrate 12 are different from each other. More specifically, the first projection 141' of the first spacer, the second projection 142' of the second spacer and the third projection 143' of the third spacer have different shapes. Herein, FIG. 5A is a perspective view showing only a part of the spacers used in the OLED display panel of the present embodiment; however, in other embodiments, the shapes of the spacers and the projections thereof may be the same as or different from those represented in FIG. 5A.

In the present embodiment, the plural spacers are disposed in an array on the second substrate 12, but the present invention is not limited thereto. According to the perspective view of the shapes of the projections shown in FIG. 5A, a distance D1 between projections of two adjacent spacers in the display region C is different from a distance D2 between protections of two adjacent spacers in the non-display region N. Particularly, the distance D1 in the display region C is larger than the distance D2 in the non-display region N. Hence, in the OLED display panel of the present embodiment, the disposition density of the spacer in the non-display region N is larger than that in the display region C, which can provide increased frictional force to prevent the shift between substrate during the assembling process. Herein, the distance D1 can be respectively in a range from 50 μm to 150 μm; preferably from 70 μm to 130 μm; and more preferably from 80 μm to 110 μm. In the present embodiment, the distance D1 is in a range from 90 μm to 100 μm.

In addition, according to the perspective view of the shapes of the projections shown in FIG. 5A, sizes and/or projected areas of the projections of the spacers in the display region C are different from those in the non-display region N. Particularly, the sizes and/or projected areas of the projections of the spacers in the display region C are larger than those in the non-display region N. Hence, in the OLED display panel of the present embodiment, since the sizes of the spacers in the non-display region N are smaller than those in the display region C, so the area of the non-display region N can be reduced to achieve the purpose of narrow frame. Herein, the sizes of the projections of the spacers in the display region C (i.e. the maximum widths of the projections) can be respectively in a range from 5 μm to 50 μm; preferably from 8 μm to 40 μm; and more preferably from 10 μm to 30 μm. In the present embodiment, the sizes of the projections of the spacers in the display region C are respectively in a range from 15 μm to 25 μm. In other embodiment, the size of the projection may be referred to the length or the diameter of the projections.

Figure 5B:
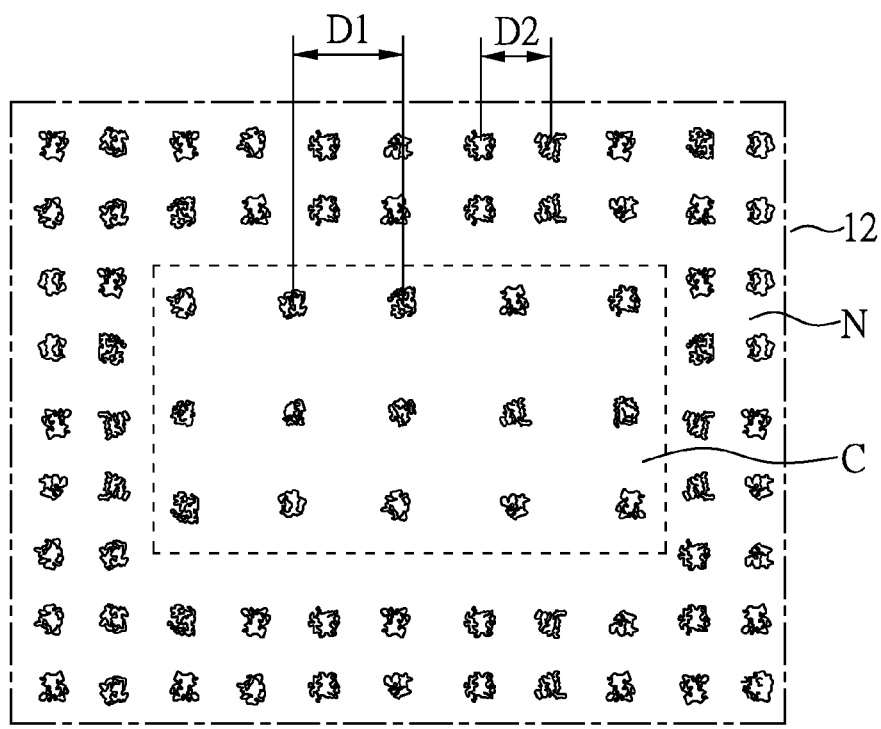

FIG. 5A is a perspective view showing possible shapes of the projections of the spacers on the second substrate in the present embodiment, but the shapes thereof may be formed as the perspective view of FIG. 5B in other embodiments. The shapes thereof in FIG. 5B are similar to those shown in FIG. 5A, except that the sizes of the projections of the spacers in the display region C are similar to those in the non-display region N.

Figure 6A:
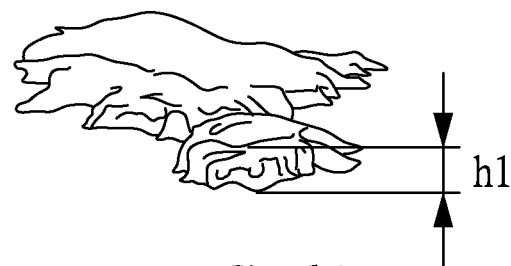
FIGS. 6A to 6C are perspective views of spacers in an OLED display panel according to Embodiment 1 of the present invention.
Figure 6B:
Figure 6C:
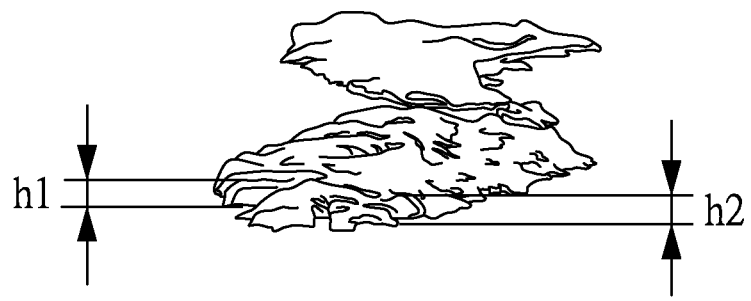
Figure 7:
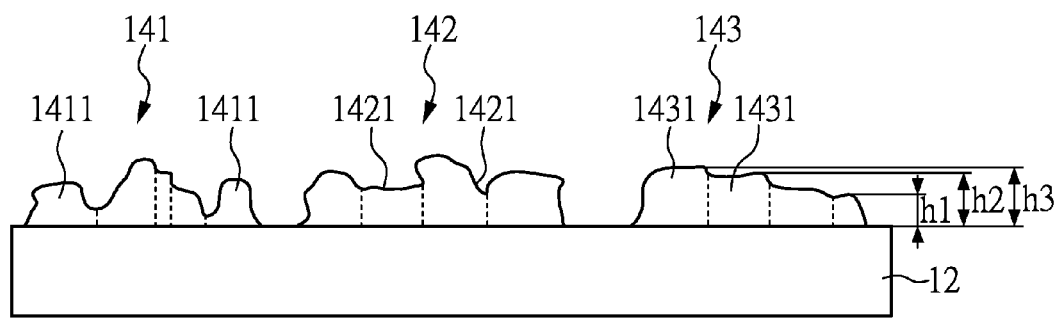
FIG. 7 is a cross-sectional view of spacers in an OLED display panel according to Embodiment 1 of the present invention.

FIGS. 6A to 6C are perspective views of spacers in the OLED display panel of the present embodiment, and FIG. 7 is a cross-sectional view thereof.

As shown in FIGS. 6A to 6C, the spacers used in the OLED display panel of the present embodiment are irregular protrusion objects, wherein the height h1 of the spacer shown in FIG. 6A is 0.615 μm, the height h1 thereof shown in FIG. 6B is 0.278 μm, and the heights h1 and h2 thereof shown in FIG. 6C are respectively 0.456 μm and 0.476 μm. Herein, only three spacers used in the OLED display panel of the present embodiment are exemplified, but the other spacers used therein may have different shapes. In addition, as shown in FIG. 7, the cross-sectional view of the spacers used in the OLED display panel of the present embodiment clearly indicates that the spacers are irregular protrusion objects. Herein, the spacer 141 has rough or uneven surfaces; particularly, plural protrusions 1411 are formed on the surfaces of the spacer 141; and at least two of the protrusions 1411 may have different size and height. In addition, the at least one of the spacer 142 has rough or uneven surfaces; particularly, plural cavities 1421 are formed in the surfaces of the spacer 142; and at least two of the cavities 1421 has different size and depth. Furthermore, at least one of the spacers 141, 142, 143 used in the OLED display panel of the present embodiment may also be considered as clusters formed by plural protrusions, which can be defined by the dotted lines shown in the FIG. 7. For example, the spacer 143 is a cluster formed by plural protrusions 1431, and heights of the protrusions 1431 in the spacer 143 are identical to or different from each other. For example, the heights h1, h2, h3 of the protrusions 1431 are different from each other; ends of the protrusions 1431 facing to the second substrate 12 connect to each other; and the protrusions 1431 are integrated with each other. However, only a part of spacers used in the OLED display panel of the present embodiment are shown in FIG. 7, but the other spacers used herein may have different shapes. In addition, FIGS. 6A to 6C and 7 are perspective views showing the structures of the spacers used in the OLED display panel of the present embodiment, which are observed under a microscope.

Embodiment 2

The structure of the OLED display panel of the present embodiment is similar to that of Embodiment 1, except for the following differences.

Figure 8:
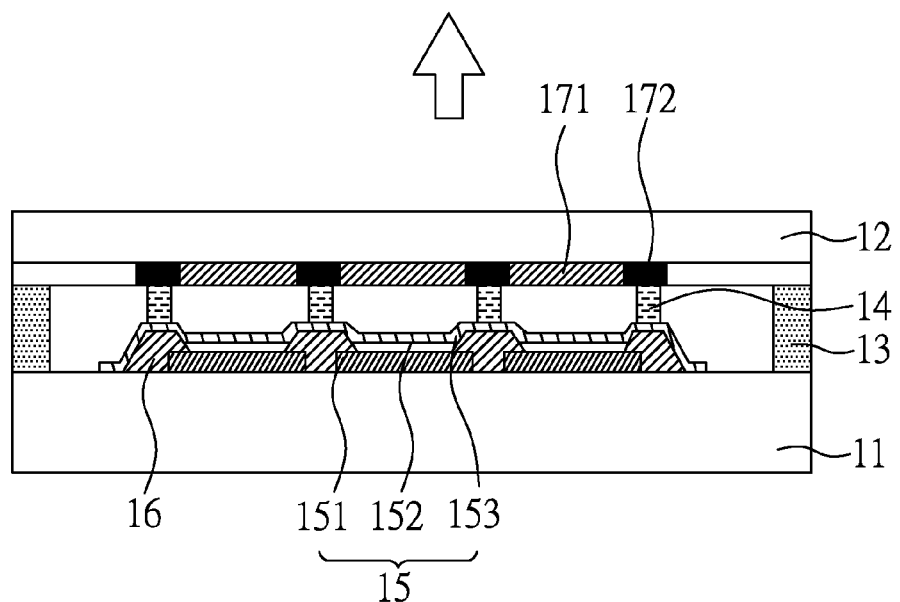
FIG. 8 is a cross-sectional view showing an OLED display panel according to Embodiment 2 of the present invention.

One difference is that the organic light emitting unit 15 used in the OLED display panel of the present embodiment comprises an organic light emitting layer 152 emitting white light, and a color filter 171 and a black matrix 172 are further disposed at the light-emitting side (i.e. between the second substrate 12 and the spacers 14), as shown in the cross-sectional view of FIG. 8 showing the OLED display panel of the present embodiment. Through the disposition of the color filter 171 and the black matrix 172, the OLED display panel of the present embodiment can emit light with different colors, such as red light, blue light and green light.

Figure 9:
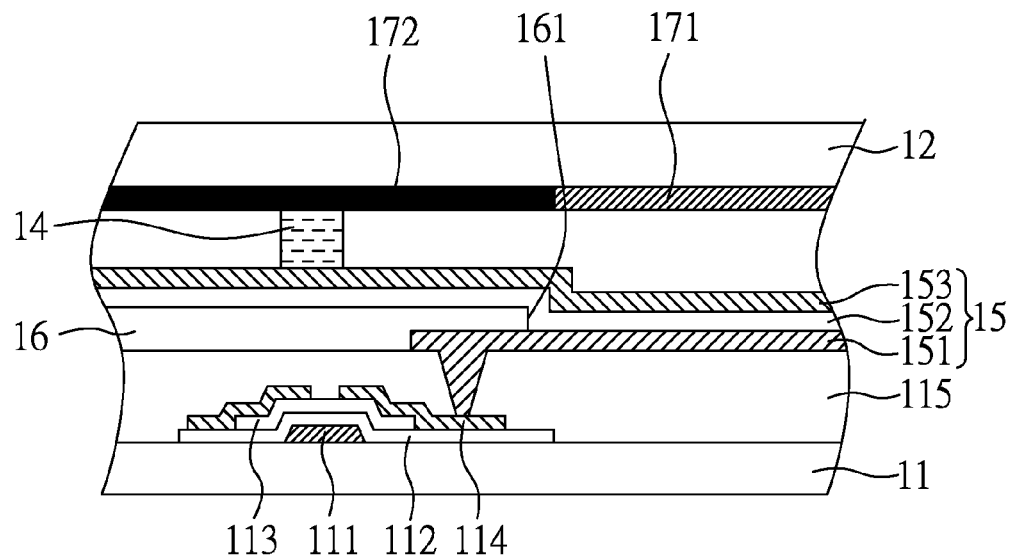
FIG. 9 is a cross-sectional view showing an OLED display panel according to Embodiment 2 of the present invention.

Another difference is that the light emitting region defined by the pixel opening 161 of the pixel defining layer 16 corresponds to the color filter 171, and the region outside the pixel opening 161 of the pixel defining layer 16 corresponds to the black matrix 172, as shown in the cross-sectional view of FIG. 9 showing the OLED display panel of the present embodiment.

Embodiment 3

The structure of the OLED display panel of the present embodiment is similar to that of Embodiment 1, except for the following differences.

Figure 10:
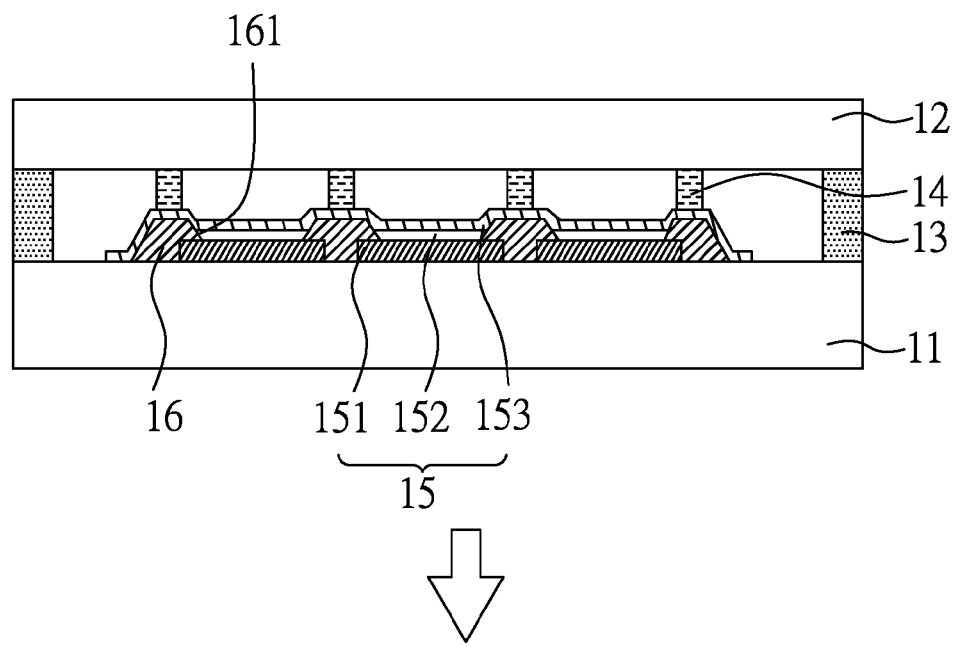
FIG. 10 is a cross-sectional view showing an OLED display panel according to Embodiment 3 of the present invention.

As shown in FIG. 10, the structure of the OLED display panel of the present embodiment is the same as that of Embodiment 1, except that the OLED display panel of the present embodiment is a bottom-emitting OLED display panel. Furthermore, in the OLED display panel of the present embodiment, only the first electrode unit 151 is a TCO electrode, and the second electrode 153 is a metal thin film electrode.

Embodiment 4

The structure of the OLED display panel of the present embodiment is similar to that of Embodiment 2, except for the following differences.

As shown in FIGS. 8 and 9 of Embodiment 2, the color filter 171 and the black matrix 172 are disposed on the second substrate 12 in the OLED display panel of Embodiment 2. However, the color filter 171 and the black matrix 172 are disposed on the first substrate 11 to obtain the bottom-emitting OLED display panel of the present embodiment, not shown in the figure. Through the disposition of the color filter 171 and the black matrix 172, an organic light emitting layer 152 can emit light with different colors, such as red light, blue light and green light. In addition, for increasing the display effect of the bottom-emitting OLED display panel of the present embodiment, a reflection layer (not shown in the figure) may be selectively disposed between the second substrate 12 and the spacers 14.

Embodiment 5

Figure 11:
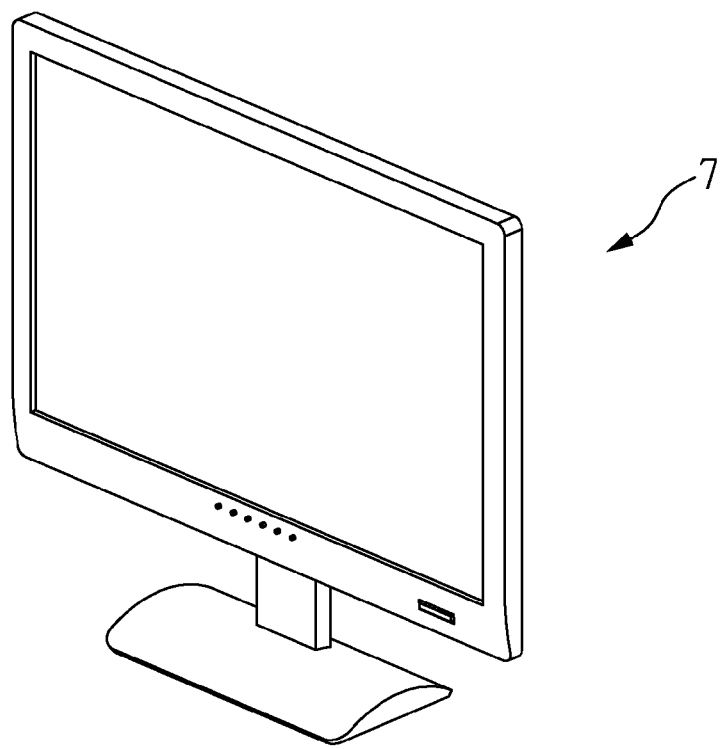
FIG. 11 is a perspective view showing an OLED display device according to Embodiment 5 of the present invention.

FIG. 11 is a perspective view showing an OLED display device of the present embodiment. Herein, the OLED display device 7 of the present embodiment comprises any one of the OLED display panels according to the aforementioned Embodiments 1 to 4.

In other embodiments, the OLED display panel of the present invention may be applied to other display devices, such as mobile phones and tablet PCs.

Although the present invention has been explained in relation to its preferred embodiment, it is to be understood that many other possible modifications and variations can be made without departing from the spirit and scope of the invention as hereinafter claimed.

What is claimed is:

1. An organic light emitting diode display panel, comprising:
    a first substrate;
    an organic light emitting layer disposed above the first substrate;
    a second substrate opposite to the first substrate, and adhered to the first substrate with a frit sealant, the second substrate having a display region and a non-display region; and
    a plurality of spacers disposed between the first substrate and the second substrate, the spacers comprising a first spacer, a second spacer, a third spacer and a fourth spacer, the first spacer and the second spacer being adjacently located in the display region, the third spacer and the fourth spacer being adjacently located in the non-display region,
    wherein a first distance is between the first spacer and the second spacer, a second distance is between the third spacer and the fourth spacer, and the first distance is different from the second distance.

2. The organic light emitting diode display panel as claimed in claim 1, wherein at least one of the spacers has a surface, which is rough.

3. The organic light emitting diode display panel as claimed in claim 2, wherein plural cavities are formed on the surfaces, and at least two of the cavities have different sizes.

4. The organic light emitting diode display panel as claimed in claim 2, wherein plural protrusions are formed on the surfaces of the spacers, and at least two of the protrusions have different sizes.

5. The organic light emitting diode display panel as claimed in claim 1, wherein a first electrode layer comprising plural first electrode units is further disposed above the first substrate, and the organic light emitting diode display panel further comprises a pixel defining layer disposed between the first electrode units.

6. The organic light emitting diode display panel as claimed in claim 5, wherein the pixel defining layer has at least one recess corresponding to at least one of the spacers.

7. The organic light emitting diode display panel as claimed in claim 1, wherein a size of the first spacer in the display region is different from a size of the third spacer in the non-display region.

8. An organic light emitting diode display device, comprising:
    a driving unit;
    an organic light emitting diode display panel electrically connecting to the driving unit, and comprising:
        a first substrate;
        an organic light emitting layer disposed above the first substrate;
        a second substrate opposite to the first substrate, and adhered to the first substrate with a frit sealant, the second substrate having a display region and a non-display region; and
        a plurality of spacers disposed between the first substrate and the second substrate, the spacers comprising a first spacer, a second spacer, a third spacer and a fourth spacer, the first spacer and the second spacer being adjacently located in the display region, the third spacer and the fourth spacer being adjacently located in the non-display region, wherein a first distance is between the first spacer and the second spacer, a second distance is between the third spacer and the fourth spacer, and the first distance is different from the second distance.

* * * * *